(12) United States Patent
Laurent et al.

(10) Patent No.: US 9,772,902 B2
(45) Date of Patent: Sep. 26, 2017

(54) ERROR CORRECTION CODE FOR UNIDIRECTIONAL MEMORY

(71) Applicant: MICRON TECHNOLOGY, INC., Boise, ID (US)

(72) Inventors: Christophe Laurent, Agrate Brianza (IT); Paolo Amato, Pagazzano (IT); Marco Sforzin, Cantu' (IT); Corrado Villa, Sovico (IT)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 14/841,372

(22) Filed: Aug. 31, 2015

(65) Prior Publication Data

US 2016/0062831 A1    Mar. 3, 2016

Related U.S. Application Data

(63) Continuation of application No. 13/846,538, filed on Mar. 18, 2013, now Pat. No. 9,124,301, which is a continuation of application No. 12/623,310, filed on Nov. 20, 2009, now Pat. No. 8,402,347.

(30) Foreign Application Priority Data

Dec. 31, 2008    (WO) .................. PCT/IT2008/000824

(51) Int. Cl.
*G06F 11/00*    (2006.01)
*G06F 11/10*    (2006.01)
*H03M 13/29*    (2006.01)
*G11C 29/52*    (2006.01)

(52) U.S. Cl.
CPC .......... *G06F 11/1068* (2013.01); *G11C 29/52* (2013.01); *H03M 13/2909* (2013.01)

(58) Field of Classification Search
CPC ........................... G06F 11/1068; G11C 29/52
USPC ........................................ 714/763, 764, 773
See application file for complete search history.

(56) References Cited

U.S. PATENT DOCUMENTS

| | | | |
|---|---|---|---|
| 5,838,698 | A | 11/1998 | Doubler et al. |
| 6,986,092 | B2 | 1/2006 | Butler et al. |
| 7,313,020 | B2 | 12/2007 | Chae et al. |
| 7,447,067 | B2 | 11/2008 | Kong et al. |
| 7,451,385 | B2 | 11/2008 | Ha et al. |
| 7,587,658 | B1 | 9/2009 | Tong et al. |
| 2004/0255225 | A1 | 12/2004 | Takai |

(Continued)

OTHER PUBLICATIONS

International Search Report dated Jul. 28, 2009 in corresponding International Application No. PCT/IT2008/000824.

(Continued)

*Primary Examiner* — Joseph Kudirka
(74) *Attorney, Agent, or Firm* — Brooks, Cameron & Huebsch, PLLC

(57) ABSTRACT

A memory array and a method of writing to a unidirectional non-volatile storage cell are disclosed whereby a user data word is transformed to an internal data word and written to one or more unidirectional data storage cells according to a cell coding scheme. A check word may be generated that corresponds to the internal data word. In some embodiments, the check word may be generated by inverting one or more bits of an intermediate check word. Other embodiments may be described and claimed.

20 Claims, 7 Drawing Sheets

(56) References Cited

U.S. PATENT DOCUMENTS

| | | |
|---|---|---|
| 2006/0077583 A1 | 4/2006 | Satori et al. |
| 2007/0168837 A1 | 7/2007 | Murin |
| 2008/0158948 A1 | 7/2008 | Sharon et al. |
| 2008/0215798 A1 | 9/2008 | Sharon et al. |
| 2010/0293434 A1* | 11/2010 | Bueb .................. G06F 11/1068 714/758 |

OTHER PUBLICATIONS

Written Opinion dated Jul. 28, 2009 in corresponding International Application No. PCT/IT2008/000824.

U.S.; Office Action dated May 15, 2012, from related application U.S. Appl. No. 12/623,310, filed Nov. 20, 2009.

U.S.; Office Action dated Sep. 6, 2012, from related application U.S. Appl. No. 12/623,310, filed Nov. 20, 2009.

* cited by examiner

Col.: 0 1 2 3 4 5 6 7     ROW:

[A] =

```
0 0 1 0 1 0 1 1     0
1 1 1 1 1 1 1 0     1
1 0 1 1 0 0 1 0     2
0 0 0 1 1 1 0 1     3

1 1 1 0 1 0 0 0     4
0 1 0 0 1 1 1 1     5
1 1 0 1 1 0 1 1     6
0 1 1 1 0 1 1 1     7
```

Where:
G = [I | A]

ERROR CORRECTION CODE FOR UNIDIRECTIONAL MEMORY

INCORPORATION BY REFERENCE TO RELATED APPLICATIONS

This application is a continuation application of U.S. application Ser. No. 13/846,538, filed Mar. 18, 2013, issued as U.S. Pat. No. 9,124,301, with issue date Sep. 1, 2015, which is a continuation application of U.S. application Ser. No. 12/623,310, filed Nov. 20, 2009, issued as U.S. Pat. No. 8,402,347, with issue date Nov. 20, 2009, the entirety of which is incorporated by reference herein. Parent U.S. application Ser. No. 12/623,310 claims the benefit of foreign priority under 35 U.S.C. §119(a) to International Patent Application No. PCT/IT08/00824, filed Dec. 31, 2008, entitled "Error Correction Code for Unidirectional Memory," the specification of which is incorporated by reference herein.

Any and all priority claims identified in the Application Data Sheet, or any correction thereto, are hereby incorporated by reference under 37 CFR 1.57.

BACKGROUND OF THE INVENTION

Field of the Invention

The present disclosure is generally directed to memory and more particularly to method and apparatus for applying Error Correction Code (ECC) in a unidirectional memory.

Description of the Related Art

Memory is an integral part of many electronic devices for storing and retrieving information. Memory may be classified on different bases, such as amount of data (for example, mass storage versus cache memory), access (for example, random access memory versus read-only memory), technology (for example, magnetic versus optical), performance (for example, archival versus execution memory), and the like. With the ubiquity of computers and communication networks for personal and business use, the need for data storage has increased exponentially in recent years. This need is especially increased due to the abundance and constant production of multimedia data such as music, video clips, and pictures. Commensurate with increased use of memory is the increased need for reliability of storage medium and also need for storage of data in absence of power. Relatively recent technologies used for solid-state storage of data, especially for mobile devices, include flash memories and phase-change memories (PCM) that retain stored information in absence of power. To increase reliability of data and reduce storage and transmission errors, error detection and/or correction codes, such as parity bits and ECC, may be used. With the non-volatile, solid-state memory technologies that depend on unidirectional programming, an update of data, such as a second write, is not possible without losing coherence of ECC check bits, unless, the memory is first erased and new ECC check bits are calculated. The process of erasure takes time and reduces memory and/or system performance.

BRIEF DESCRIPTION OF THE DRAWINGS

Non-limiting embodiments of the present disclosure are described with reference to the following drawings. For a better understanding of the present disclosure, the detailed description that follows is to be read in association with the accompanying drawings referenced therein, wherein.

DETAILED DESCRIPTION OF THE PREFERRED EMBODIMENT

Figure 1:
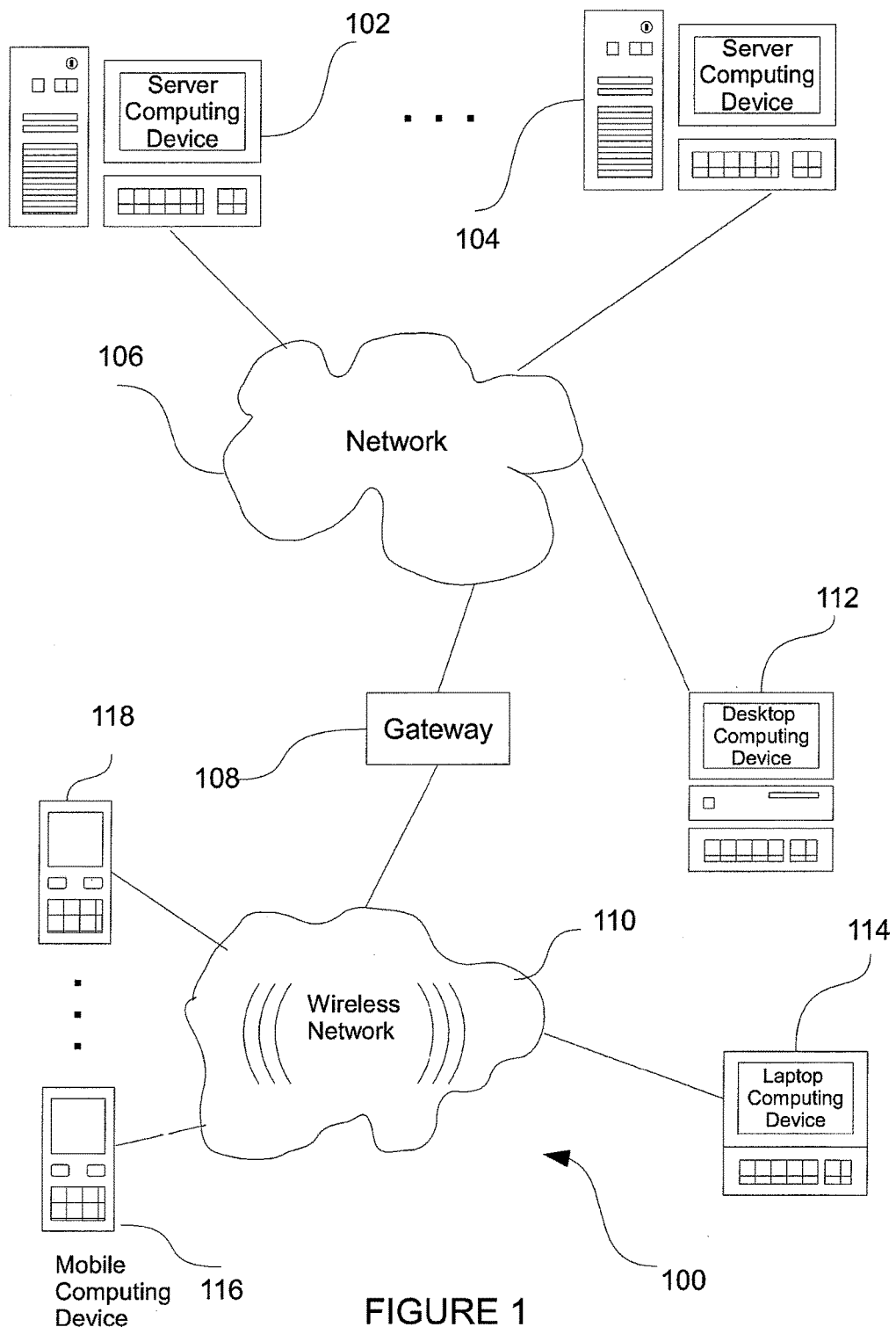
FIG. 1 shows an embodiment of a network computing environment wherein the disclosure may be practiced.

The present disclosure will now be described more fully hereinafter with reference to the accompanying drawings, which form a part hereof, and which show, by way of illustration, specific embodiments of the present disclosure. This disclosure may be embodied in many different forms and should not be construed as limited to the embodiments set forth herein. Rather, these embodiments are provided so that this disclosure is thorough and complete, and may fully convey the scope of the disclosure to those of ordinary skill in the art. Among other things, the present disclosure may be embodied as methods or devices. Accordingly, the present disclosure may be in the form of an entirely hardware embodiment, an entirely software embodiment or an embodiment combining software and hardware aspects. The following detailed description is, therefore, not to be taken in a limiting sense.

Briefly described, in one aspect of the present disclosure an electronic or computing device is disclosed including a processor configured to process input data and a plurality of unidirectional data storage cells coupled with the processor. Each of the data storage cells have a number of ordered states for storing at least a portion of the input data. The data storage cells are configured to represent data according to an internal coding. The data storage cells perform a first write operation to change the first data to second data; perform a second write operation to change the second data to third data; and generate a coherent check word based on the third data without performing an erase operation on the data storage cell. Customarily, because of the nature of a unidirectional memory, an erase operation is required to reset the storage cell for new data if the new data requires the cell state to change in an opposite direction. For example, a capacitive memory with four states may be charged-up three times, but it typically cannot be charged down from any state to its previous state. In such cases, for example if the state of the capacitive cell is to be changed from state #3 to state #2, the cell capacitor typically needs to be completely discharged and again be charged-up to state #2.

In another aspect of the present disclosure a memory array having a plurality of unidirectional data storage cells is disclosed, some of which have a plurality of ordered states and are configured to use a memory interface to access the data storage cells. The data storage cells represent first data according to an internal coding; perform a first write operation to change the first data to second data; perform a second write operation to change the second data to third data; and generate a coherent check word based on the third data without performing an erase operation on the data storage cell.

In yet another aspect of the present disclosure a memory array having a plurality of unidirectional data storage cells is disclosed, some of which have a plurality of ordered states, and are configured to use a memory interface to access data storage cells using a multi-component address. The data storage cells represent first data according to an internal coding; generate a first check word at least partially based on the first data; and invert at least one bit in the first check word to generate a first coherent check word associated with the first data.

In yet another aspect of the present disclosure a method of writing data to a unidirectional memory device is disclosed. The method includes representing first data according to an internal coding; performing a first write operation to change the first data to second data; performing a second write operation to change the second data to third data; and generating a coherent check word at least partially based on the third data without performing an erase operation on the unidirectional memory device.

Throughout the specification and claims, the following terms take the meanings explicitly associated herein, unless the context clearly dictates otherwise. The phrases "in one embodiment," "in an illustrative embodiment," and the like, as used herein do not necessarily refer to the same embodiment, though they may. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" may include "in" and "on," unless otherwise stated.

The term "memory array" as used herein, may represent a logical grid (which may or may not correspond to a physical grid) of memory components that are addressable by two address components, such as a row value and a column value. Additionally, the term memory array may refer to a multi-dimensional or N-dimensional array, addressable by N independent address components, such as 3-dimensional arrays or banks of 2-or 3-dimensional arrays.

The terms "flash," "flash memory," "NOR flash," "NAND flash," and the like, as used herein, may indicate non-volatile memories that may be used to store discrete data, binary or otherwise, in a unidirectional manner, such that internal states of the memory may be changed from state [i] to state [i+1], but not from state [i+1] back to state [i] without first erasing the memory to reset the memory to an initial state.

The term "cell" or "storage cell," as used herein, may denote a storage component of the memory array where actual data are recorded and represented. The storage cell may have multiple internal states or levels that may be used to represent binary data. In some memory technologies, such as Phase-Change-Memory (PCM) cells, the storage cell may be multi-phase, where each phase may correspond to a state. These states may include "Set," "Reset," and one or more intermediate states.

The terms "internal state," "memory state," and the like, as used herein, may indicate physically or electrically distinct states of storage cell material, such as a crystalline state or a charged state, respectively, used to represent a logical/Boolean value, such as a logic-1, or logic-0. Those skilled in the art will appreciate that representation of logic-1 and logic-0 values are arbitrary and such representations may be freely chosen as one symbol or another, as long as such representation is applied consistently throughout a system and/or process. For example, a "high" signal level or a signal transition from low-to-high may be chosen to represent logic-0 or logic-1.

The terms "ECC," "error correction code," "error detection and correction code," "check bit," "parity bit," "ECC data," "parity data," and the like, as used herein, may indicate bits of binary information calculated from bits of application and/or user data to detect and/or correct corrupted bits in application/user data.

The terms "data," "user data," "application data," "original data," "input data," and the like, as used herein, may indicate data that is provided before application of an error detection/correction scheme, such as ECC.

The terms "codeword," "code," and the like, as used herein, may denote the output data after the application of an error detection/correction scheme to the input data plus check bits that are generated as a result of applying the error detection/correction to the input data, as one unit. The portion of the codeword representing the input data, as distinct from check bits, may be encoded or may be identical to the input data.

The terms "level," "flash level," "flash cell level," and the like, as used herein, may indicate distinct internal (usually unidirectional) states of a storage cell, where the levels are arranged as an ordered sequence and associated with binary data.

The terms "coding," "data coding," "internal coding," "encoding," "data encoding," "level coding," "level encoding," "cell coding," "cell binary coding," and the like, as used herein, may indicate a mapping from or an assignment/association of a binary number to each level included in a sequence of levels of a storage cell. For example, level-0 may be mapped to binary number "11," while level-1 may be mapped to binary number "10." The binary numbers used in such mapping need not be in numerical order.

The terms "erasure state," "initial state," "level 0 state," and the like, as used herein, may indicate the first state that may be established in the sequence of levels in a unidirectional storage cell, for example, by storing minimum allowable and/or usable electrical charge in a storage cell. Alternatively, the first state may be associated with maximum allowable/usable charge instead of minimum.

The term "final state," as used herein, may indicate the last state that may be established in the sequence of levels in a unidirectional storage cell, for example, by storing maximum allowable and/or usable electrical charge in a storage cell. Alternatively, the first state may be associated with minimum allowable/usable charge instead of maximum.

The term "bit inversion," as used herein, may indicate a subset of parity check bits that need to be inverted to recover user data after application of an internal coding (level coding) to user data.

The term "transformation," as used herein, may indicate a change of representation of user data from a user coding to an internal coding. The term "inverse transformation" may indicate a change of representation of user data from the internal coding back to the user coding.

The term "generator matrix," "generator," "ECC generator," "code generation matrix," and the like, as used herein, may indicate a matrix that may be used to generate ECC bits from user data.

The following briefly describes illustrative embodiments of the disclosure to provide a basic understanding of some aspects of the disclosure. This brief description is not intended as an extensive overview. It is not intended to identify key or critical elements, or to delineate or otherwise narrow the scope. Its purpose is merely to present some concepts in a simplified form as a prelude to the more detailed description that is presented later.

Illustrative Operating Environment

FIG. 1 shows components of an illustrative environment in which the disclosure may be practiced. Not all the shown components may be required to practice the disclosure, and variations in the arrangement and type of the components may be made without departing from the spirit or scope of the disclosure. System 100 may include Local Area Networks (LAN) and Wide Area Networks (WAN) shown collectively as Network 106, wireless network 110, gateway 108 configured to connect remote and/or different types of networks together, client devices 112-118, and server devices 102-104.

One embodiment of an electronic or computing device usable as one of client devices 112-118 is described in more detail below with respect to FIG. 2. Briefly, however, client devices 112-118 may include virtually any device capable of receiving and sending a message over a network, such as wireless network 110, or the like. Such devices include portable devices such as, cellular telephones, smart phones, display pagers, radio frequency (RF) devices, music players, digital cameras, infrared (IR) devices, Personal Digital Assistants (PDAs), handheld computers, laptop computers, wearable computers, tablet computers, integrated devices combining one or more of the preceding devices, or the like. Client device 112 may include virtually any computing device that typically connects using a wired communications medium such as personal computers, multiprocessor systems, microprocessor-based or programmable consumer electronics, network PCs, or the like. In one embodiment, one or more of client devices 112-118 may also be configured to operate over a wired and/or a wireless network.

Client devices 112-118 typically range widely in terms of capabilities and features. For example, a cell phone may have a numeric keypad and a few lines of monochrome LCD display on which only text may be displayed. In another example, a web-enabled client device may have a touch sensitive screen, a stylus, and several lines of color LCD display in which both text and graphic may be displayed.

A web-enabled client device may include a browser application that is configured to receive and to send web pages, web-based messages, or the like. The browser application may be configured to receive and display graphic, text, multimedia, or the like, employing virtually any web based language, including a wireless application protocol messages (WAP), or the like. In one embodiment, the browser application may be enabled to employ one or more of Handheld Device Markup Language (HDML), Wireless Markup Language (WML), WMLScript, JavaScript, Standard Generalized Markup Language (SGML), HyperText Markup Language (HTML), eXtensible Markup Language (XML), or the like, to display and send information.

Client devices 112-118 also may include at least one other client application that is configured to receive content from another computing device, including, without limit, server computing devices 102-104. The client application may include a capability to provide and receive textual content, multimedia information, or the like. The client application may further provide information that identifies itself, including a type, capability, name, or the like. In one embodiment, client devices 112-118 may uniquely identify themselves through any of a variety of mechanisms, including a phone number, Mobile Identification Number (MIN), an electronic serial number (ESN), mobile device identifier, network address, such as IP (Internet Protocol) address, Media Access Control (MAC) layer identifier, or other identifier. The identifier may be provided in a message, or the like, sent to another computing device.

Client devices 112-118 may also be configured to communicate a message, such as through email, Short Message Service (SMS), Multimedia Message Service (MMS), instant messaging (IM), Internet relay chat (IRC), Mardam-Bey's IRC (mIRC), Jabber, or the like, to another computing device. However, the present disclosure is not limited to these message protocols, and virtually any other message protocol may be employed.

Client devices 112-118 may further be configured to include a client application that enables the user to log into a user account that may be managed by another computing device. Such user account, for example, may be configured to enable the user to receive emails, send/receive IM messages, SMS messages, access selected web pages, download scripts, applications, or a variety of other content, or perform a variety of other actions over a network. However, managing of messages or otherwise accessing and/or downloading content, may also be performed without logging into the user account. Thus, a user of client devices 112-118 may employ any of a variety of client applications to access content, read web pages, receive/send messages, or the like. In one embodiment, for example, the user may employ a browser or other client application to access a web page hosted by a web server implemented as server computing device 102. In one embodiment, messages received by client devices 112-118 may be saved in non-volatile memory, such as flash and/or PCM, across communication sessions and/or between power cycles of client devices 112-118.

Wireless network 110 may be configured to couple client devices 114-118 to network 106. Wireless network 110 may include any of a variety of wireless sub-networks that may further overlay stand-alone ad-hoc networks, and the like, to provide an infrastructure-oriented connection for client devices 114-118. Such sub-networks may include mesh networks, Wireless LAN (WLAN) networks, cellular networks, and the like. Wireless network 110 may further include an autonomous system of terminals, gateways, routers, and the like connected by wireless radio links, and the like. These connectors may be configured to move freely and randomly and organize themselves arbitrarily, such that the topology of wireless network 110 may change rapidly.

Wireless network 110 may further employ a plurality of access technologies including 2nd (2G), 3rd (3G) generation radio access for cellular systems, WLAN, Wireless Router (WR) mesh, and the like. Access technologies such as 2G, 3G, and future access networks may enable wide area coverage for mobile devices, such as client devices 114-118 with various degrees of mobility. For example, wireless network 110 may enable a radio connection through a radio network access such as Global System for Mobil communication (GSM), General Packet Radio Services (GPRS), Enhanced Data GSM Environment (EDGE), WEDGE, Bluetooth, High Speed Downlink Packet Access (HSDPA), Universal Mobile Telecommunications System (UMTS), Wi-Fi, Zigbee, Wideband Code Division Multiple Access (WCDMA), and the like. In essence, wireless network 110 may include virtually any wireless communication mechanism by which information may travel between client devices 112-118 and another computing device, network, and the like.

Network 106 is configured to couple one or more servers depicted in FIG. 1 as server devices 102-104 and their respective components with other computing devices, such as client device 112, and through wireless network 110 to client devices 114-118. Network 106 is enabled to employ any form of computer readable media for communicating information from one electronic device to another. Also, network 106 may include the Internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another.

Communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communications links known to those skilled in the art. Furthermore, remote computers and other related electronic devices could be remotely connected to either LANs or WANs via a modem and temporary telephone link. Network 106 may include any communication method by which information may travel between computing devices. Additionally, communication media typically may enable transmission of computer-readable instructions, data structures, program modules, or other types of content, virtually without limit. By way of example, communication media includes wired media such as twisted pair, coaxial cable, fiber optics, wave guides, and other wired media and wireless media such as acoustic, RF, infrared, and other wireless media.

Illustrative Client Device Configuration

Figure 2:
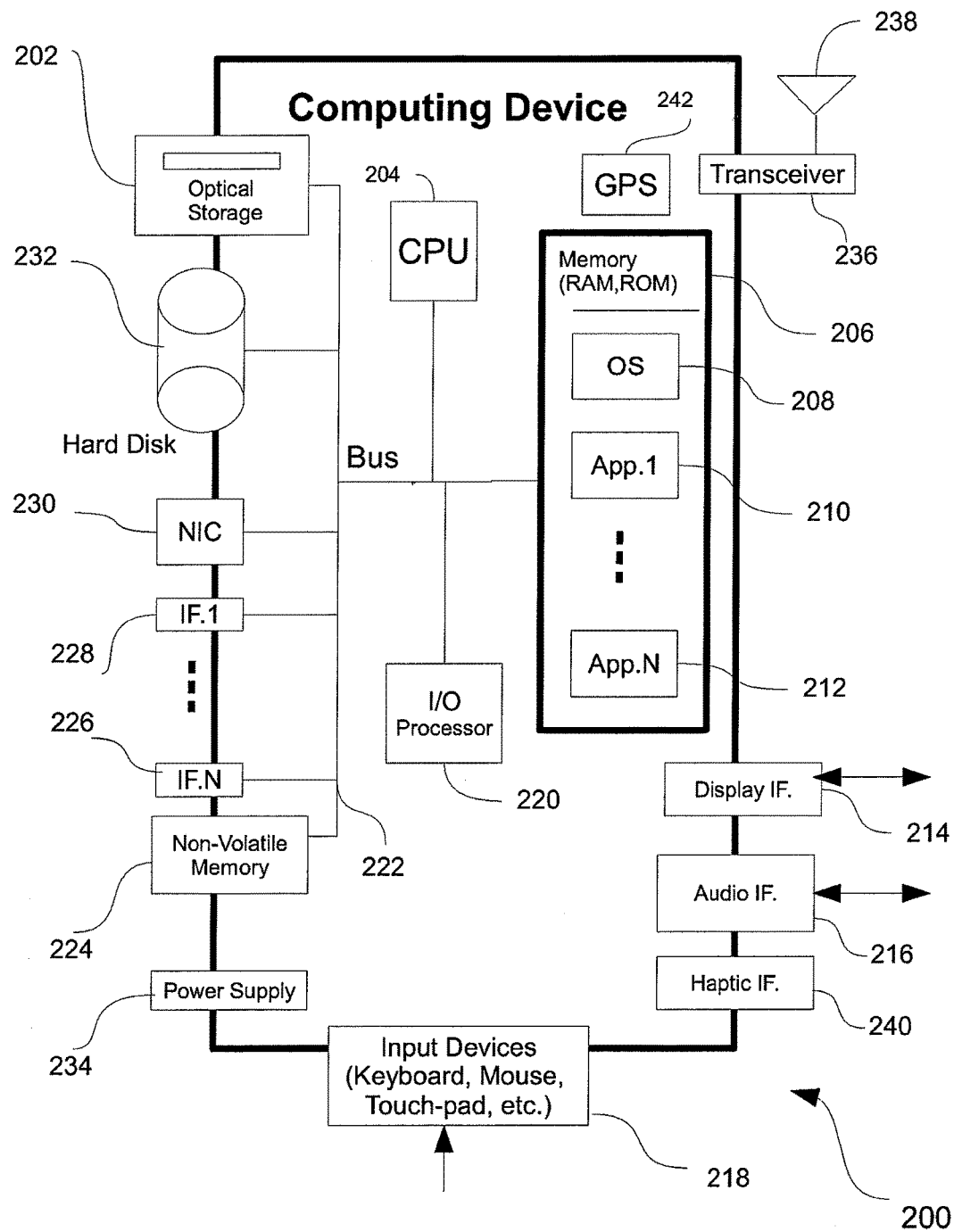
FIG. 2 shows an embodiment of a computing device that may be used in the network computing environment of FIG. 1.

FIG. 2 shows an illustrative electronic or computing device 200 that may represent any one of the server and/or client devices shown in FIG. 1. A client device represented by electronic or computing device 200 (hereinafter, may be simply "computing device") may include less or more than all the components shown in FIG. 2 depending on the functionality needed. For example, a mobile client device may include the transceiver 236 and antenna 238, while a server device 102 of FIG. 1 may not include these components. Those skilled in the art will appreciate that the scope of integration of components of computing device 200 may be different from what is shown. As such, some of the components of computing device 200 shown in FIG. 2 may be integrated together as one unit. For example, NIC 230 and transceiver 236 may be implemented as an integrated unit. Additionally, different functions of a single component may be separated and implemented across several components instead. For example, different functions of I/O processor 220 may be separated into two or more processing units.

With continued reference to FIG. 2, computing device 200 includes optical storage 202, Central Processing Unit (CPU) 204, memory module 206, display interface 214, audio interface 216, input devices 218, Input/Output (I/O) processor 220, bus 222, non-volatile memory 224, various other interfaces 226-228, network interface, e.g. network interface card (NIC) 230, hard disk 232, power supply 234, transceiver 236, antenna 238, haptic interface 240, and Global Positioning System (GPS) unit 242. Memory module 206 may include software such as Operating System (OS) 208, and a variety of software application programs 210-212. Computing device 200 may also include other components not shown in FIG. 2. For example, computing device 200 may further include an illuminator (for example, a light), graphic interface, and portable storage media such as USB drives. Computing device 200 may also include other processing units, such as a math co-processor, graphics processor/accelerator, and a Digital Signal Processor (DSP).

Optical storage device 202 may include optical drives for using optical media, such as CD (Compact Disc), DVD (Digital Video Disc), and the like. Optical storage devices 202 may provide inexpensive ways for storing information for archival and/or distribution purposes.

Central Processing Unit (CPU) 204 may be the main processor for software program execution in computing device 200. CPU 204 may represent one or more processing units that obtain software instructions from memory module 206 and execute such instructions to carry out computations and/or transfer data between various sources and destinations of data, such as hard disk 232, I/O processor 220, display interface 214, input devices 218, non-volatile memory 224, and the like.

Memory module 206 may include RAM (Random Access Memory), ROM (Read Only Memory), and other storage means, mapped to one addressable memory space. Memory module 206 illustrates one of many types of computer storage media for storage of information such as computer readable instructions, data structures, program modules or other data. Memory module 206 may store a basic input/output system (BIOS) for controlling low-level operation of computing device 200. Memory module 206 may also store OS 208 for controlling the general operation of computing device 200. It will be appreciated that OS 208 may include a general-purpose operating system such as a version of UNIX, or LINUX™, or a specialized client communication operating system such as Windows Mobile™, or the Symbian® operating system. OS 208 may, in turn, include or interface with a Java virtual machine (JVM) module that enables control of hardware components and/or operating system operations via Java application programs.

Memory module 206 may further include one or more distinct areas (by address space and/or other means), which can be utilized by computing device 200 to store, among other things, applications and/or other data. For example, one area of memory module 206 may be set aside and employed to store information that describes various capabilities of computing device 200, a device identifier, and the like. Such identification information may then be provided to another device based on any of a variety of events, including being sent as part of a header during a communication, sent upon request, or the like. One common software application is a browser program that is generally used to send/receive information to/from a web server. In one embodiment, the browser application is enabled to employ Handheld Device Markup Language (HDML), Wireless Markup Language (WML), WMLScript, JavaScript, Standard Generalized Markup Language (SGML), HyperText Markup Language (HTML), eXtensible Markup Language (XML), and the like, to display and send a message. However, any of a variety of other web based languages may also be employed. In one embodiment, using the browser application, a user may view an article or other content on a web page with one or more highlighted portions as target objects.

Display interface 214 may be coupled with a display unit (not shown), such as liquid crystal display (LCD), gas plasma, light emitting diode (LED), or any other type of display unit that may be used with computing device 200. Display units coupled with display interface 214 may also include a touch sensitive screen arranged to receive input from an object such as a stylus or a digit from a human hand. Display interface 214 may further include interface for other visual status indicators, such Light Emitting Diodes (LED), light arrays, and the like. Display interface 214 may include both hardware and software components. For example, display interface 214 may include a graphic accelerator for rendering graphic-intensive outputs on the display unit. In one embodiment, display interface 214 may include software and/or firmware components that work in conjunction with CPU 204 to render graphic output on the display unit.

Audio interface 216 is arranged to produce and receive audio signals such as the sound of a human voice. For example, audio interface 216 may be coupled to a speaker and microphone (not shown) to enable communication with a human operator, such as spoken commands, and/or generate an audio acknowledgement for some action.

Input devices 218 may include a variety of device types arranged to receive input from a user, such as a keyboard, a keypad, a mouse, a touchpad, a touch-screen (described with respect to display interface 214), a microphone for spoken command input (describe with respect to audio interface 216), and the like.

I/O processor 220 is generally employed to handle transactions and communications with peripheral devices such as mass storage, network, input devices, display, and the like, which couple computing device 200 with the external world. In small, low power computing devices, such as some mobile devices, functions of the I/O processor 220 may be integrated with CPU 204 to reduce hardware cost and complexity. In one embodiment, I/O processor 220 may be the primary software interface with all other device and/or hardware interfaces, such as optical storage 202, hard disk 232, interfaces 226-228, display interface 214, audio interface 216, and input devices 218.

An electrical bus 222 internal to computing device 200 may be used to couple various other hardware components, such as CPU 204, memory module 206, I/O processor 220, and the like, to each other for transferring data, instructions, status, and other similar information.

Non-volatile memory 224 may include memory built into computing device 200, or portable storage medium, such as USB drives that may include PCM arrays, flash memory including NOR and NAND flash, pluggable hard drive, and the like. In one embodiment, portable storage medium may behave similarly to a disk drive. In another embodiment, portable storage medium may present an interface different than a disk drive, for example, a read-only interface used for loading/supplying data and/or software.

Various other interfaces 226-228 may include other electrical and/or optical interfaces for connecting to various hardware peripheral devices and networks, such as IEEE 1394 also known as FireWire, Universal Serial Bus (USB), Small Computer Serial Interface (SCSI), parallel printer interface, Universal Synchronous Asynchronous Receiver Transmitter (USART), Video Graphics Array (VGA), Super VGA (SVGA), and the like.

Network Interface Card (NIC) 230 may include circuitry for coupling computing device 200 to one or more networks, and is generally constructed for use with one or more communication protocols and technologies including, but not limited to, Global System for Mobile communication (GSM), code division multiple access (CDMA), time division multiple access (TDMA), user datagram protocol (UDP), transmission control protocol/Internet protocol (TCP/IP), SMS, general packet radio service (GPRS), WAP, ultra wide band (UWB), IEEE 802.16 Worldwide Interoperability for Microwave Access (WiMax), SIP/RTP, Bluetooth, Wi-Fi, Zigbee, UMTS, HSDPA, WCDMA, WEDGE, or any of a variety of other wired and/or wireless communication protocols.

Hard disk 232 is generally used as a mass storage device for computing device 200. In one embodiment, hard disk 232 may be a Ferro-magnetic stack of one or more disks forming a disk drive embedded in or coupled to computing device 200. In another embodiment, hard drive 232 may be implemented as a solid-state device configured to behave as a disk drive, such as a flash-based hard drive. In yet another embodiment, hard drive 232 may be a remote storage accessible over network interface 230 or another interface 226, but acting as a local hard drive. Those skilled in the art will appreciate that other technologies and configurations may be used to present a hard drive interface and functionality to computing device 200 without departing from the spirit of the present disclosure.

Power supply 234 provides power to computing device 200. A rechargeable or non-rechargeable battery may be used to provide power. The power may also be provided by an external power source, such as an AC adapter or a powered docking cradle that supplements and/or recharges a battery.

Transceiver 236 generally represents transmitter/receiver circuits for wired and/or wireless transmission and receipt of electronic data. Transceiver 236 may be a stand-alone module or be integrated with other modules, such as NIC 230. Transceiver 236 may be coupled with one or more antennas for wireless transmission of information.

Antenna 238 is generally used for wireless transmission of information, for example, in conjunction with transceiver 236, NIC 230, and/or GPS 242. Antenna 238 may represent one or more different antennas that may be coupled with different devices and tuned to different carrier frequencies configured to communicate using corresponding protocols and/or networks. Antenna 238 may be of various types, such as omni-directional, dipole, slot, helical, and the like.

Haptic interface 240 is configured to provide tactile feedback to a user of computing device 200. For example, the haptic interface may be employed to vibrate computing device 200, or an input device coupled to computing device 200, such as a game controller, in a particular way when an event occurs, such as hitting an object with a car in a video game.

Global Positioning System (GPS) unit 242 can determine the physical coordinates of computing device 200 on the surface of the Earth, which typically outputs a location as latitude and longitude values. GPS unit 242 can also employ other geo-positioning mechanisms, including, but not limited to, triangulation, assisted GPS (AGPS), E-OTD, CI, SAI, ETA, BSS or the like, to further determine the physical location of computing device 200 on the surface of the Earth. It is understood that under different conditions, GPS unit 242 can determine a physical location within millimeters for computing device 200. In other cases, the determined physical location may be less precise, such as within a meter or significantly greater distances. In one embodiment, however, a mobile device represented by computing device 200 may, through other components, provide other information that may be employed to determine a physical location of the device, including for example, a MAC address, IP address, or the like.

The above-described illustrative operating environment and computing device configuration generally contemplate embodiments in which a computing device is used in a client/server network communication environment. However, in other embodiments, devices implementing memory/storage described herein may be used in other network communication environments (e.g., a peer-to-peer network) or even in non-networked environments (e.g., as a non-networked digital camera, music player, etc.).

Figure 3:
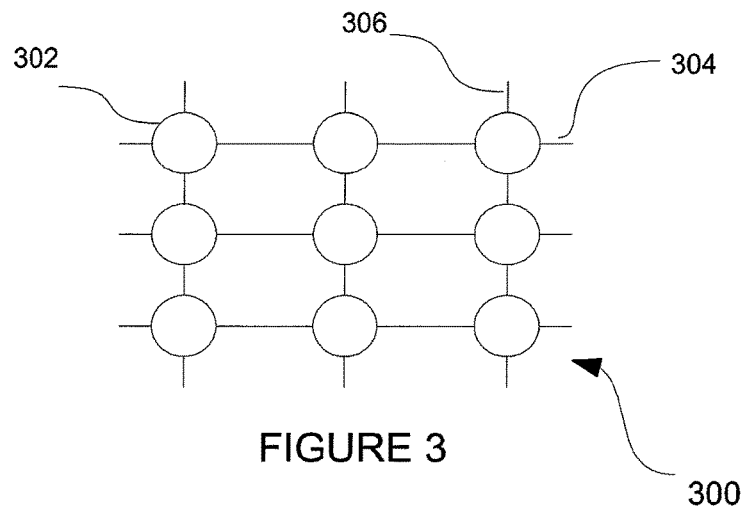
FIG. 3 shows an embodiment of a memory array including a plurality of memory cells.

FIG. 3 shows a memory array 300 of storage cells. In one embodiment, the memory array 300 includes row address line 304 and column address line 306 used to select one bit of information stored in storage cell 302. Memory array 300 may be a planar array, a linear array, or an array organized in a different physical arrangement than a two-dimensional (2-D) array. In another embodiment, array 300 may be arranged as a 3-D array each cell 302 of which is addressable by three independent address lines (not shown). In yet another embodiment, array 300 may be an N-dimensional array each storage cell of which is addressed using N distinct address components. For example, in a 4-D array, one address component may identify a memory bank; another may identify a memory segment, while other address components may identify a row and a column. Those skilled in the art will appreciate that many memory array structures are possible without departing from the spirit of the disclosure.

In one embodiment, memory array 300 may be coupled with CPU 204 of FIG. 2 that generates an address to access a particular storage cell within array 300. Memory array 300 may be coupled with CPU 204 indirectly, for example, using a memory controller for generating address data. In one embodiment, storage cell 302 may be flash storage cell, as more fully described with respect to FIG. 4 below.

Figure 4:
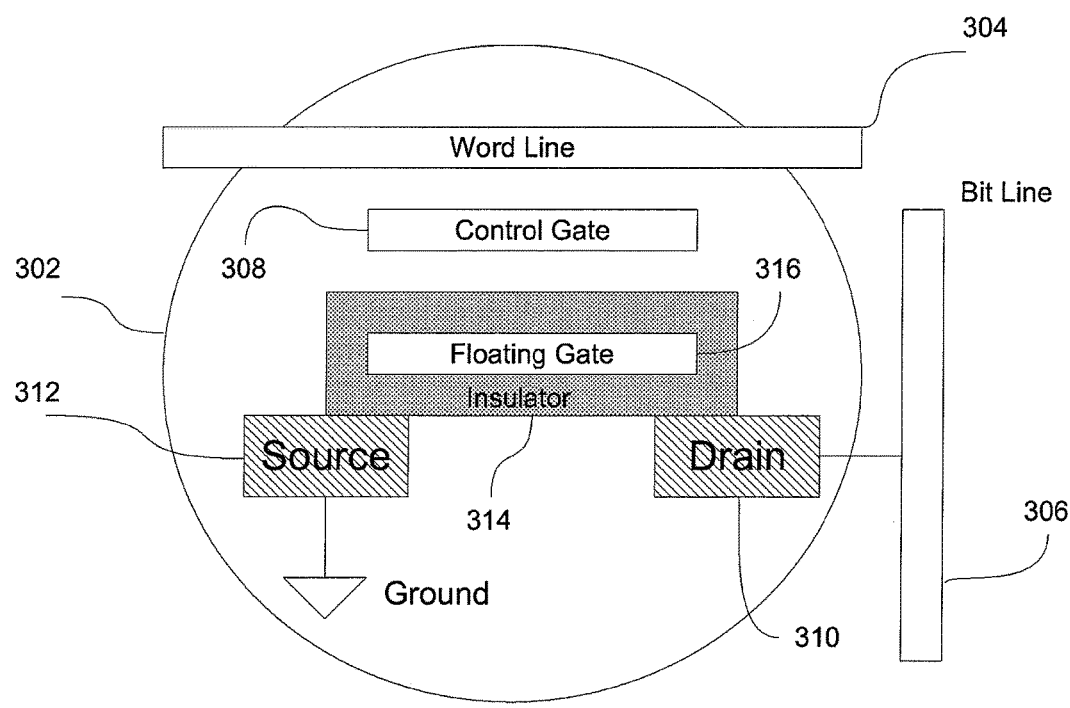
FIG. 4 shows an embodiment of a flash memory cell.

FIG. 4 shows an illustrative embodiment of a flash storage cell that may be used as a storage element 302 in array 300 of FIG. 3. In one embodiment, the structure of flash storage cell 302 includes a row electrode implemented, for example, by row address line 304, and a column electrode implemented, for example, by column address line 306. Flash storage cell 302 may include control gate 308, insulator 314 surrounding floating gate 316, drain 310, and source 312.

Line 304 may be coupled to control gate 308 to control the operation of the storage cell. Line 306 may be coupled with drain 310 to control read/write operation to individual storage cells within array 300 of FIG. 3. Drain 310, source 312, and floating gate 316 together form a transistor. When this transistor is turned on by voltages applied to lines 304 and 306, a fraction of the charge conducted through the transistor is accumulated at the insulator 314, via a hot electron injection process (used, for example, in NOR flash memory), and stays there until discharged. Generally, the charge that accumulates on the insulator 314 provides the non-volatility feature of the flash memory. By applying appropriate voltages to lines 304 and 306, the accumulated charge on insulator 314 may be removed, for example, via a tunneling process. Removal of electrons may not be well controlled resulting in a complete erasure of the storage cell. Thus, many non-volatile memory technologies, such as flash memory, which depend on charge accumulation and maintenance to hold data in absence of power, use a unidirectional process of writing data in the sense that charge may be added to the cell in a controlled and gradual manner (direction of charge), but cannot be removed gradually (direction of discharge) with adequate precision or at all.

In one embodiment, each cell of a flash memory may be used to store one or more bits of discrete information by providing multiple charge levels that correspond to multiple states or cell levels. For example, a cell with four states may be used to represent two bits of information, each level corresponding to one combination of two binary bits, as more fully described below with respect to FIG. 6.

Figure 5:
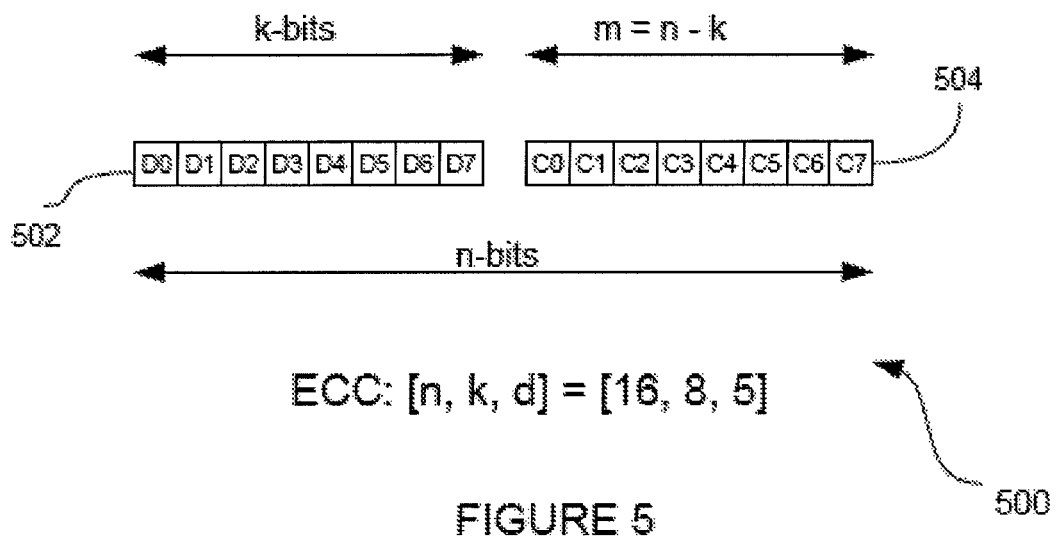
FIG. 5 shows a graph depicting an illustrative example of data and ECC check bits.

FIG. 5 shows a graph depicting an illustrative example of data and ECC check bits. Generally, data stored in memory, volatile and non-volatile alike may get corrupted for various reasons, such as electrical noise, cosmic rays, momentary voltage fluctuations/spikes in a computer system, and the like. Similarly, data may get corrupted during transmission for similar reasons. Corruption of binary data generally takes the form of flipped bits. That is, a bit that is originally binary 1 turns to binary 0, and vice versa. Many techniques are available to detect and/or correct bit errors. For example, bit repetition schemes, parity schemes, checksums, CRC (Cyclic Redundancy Check), Hamming code based schemes, and the like.

The general idea behind error detection and correction schemes is that some extra check bits are calculated based on an algorithm from original user data bits, which are stored and/or transmitted with the original data bits. If an error occurs during storage or transmission, the check bits are used to detect and/or correct such bit errors. How many bit errors may be detected or corrected is generally dependent on the detection/correction scheme used as well as the number of check bits. Generally, the more check bits that are used the more bit errors may be detected and/or corrected. Such error protection increases the cost of storage and/or transmission by increasing the amount of storage and/or transmission bandwidth needed to store and/or transmit the extra check bits. The original inputs bits (i.e., the data before application of error detection/correction scheme) and the check bits together form a codeword. Thus, a codeword may be partitioned into two distinct portions: output data representing the input data, and check bits generated as a result of applying the error detection/correction scheme to the input data.

There are two broad and main categories of error detection/correction schemes: block and convolutional codes. Block codes include schemes that operate on fixed-sized blocks or pages of data, for example, data blocks of 8 bits, 64 bits, 512 bits, and the like. Convolutional schemes operate on streams of bits of arbitrary length without definite or predefined boundaries. Block and convolutional schemes may also be combined into more comprehensive and complicated concatenated coding schemes for error detection/correction.

ECC is a common scheme used for binary error detection/correction. The illustrative example of FIG. 5 shows an ECC codeword 500 including output data word 502 and check word 504. ECC code may be represented as a 3-tuple [n, k, d], where n is the total length of codeword 500, k is the length of the output data, and d is the minimum distance (for example, Hamming distance). A code may correct t bits of corrupted data when the minimum distance, $d=2t+1$. The number of check bits, $m=n-k$. In the example shown, [n, k, d]=[16, 8, 5], indicating that total codeword 500 has 16 bits, 8 of which form the output data. The minimum distance for this ECC code, $d=5$. As data stored in a storage cell are represented by a particular coding of the cell levels, such coding can affect the application of ECC to the (input) data.

Figure 6:
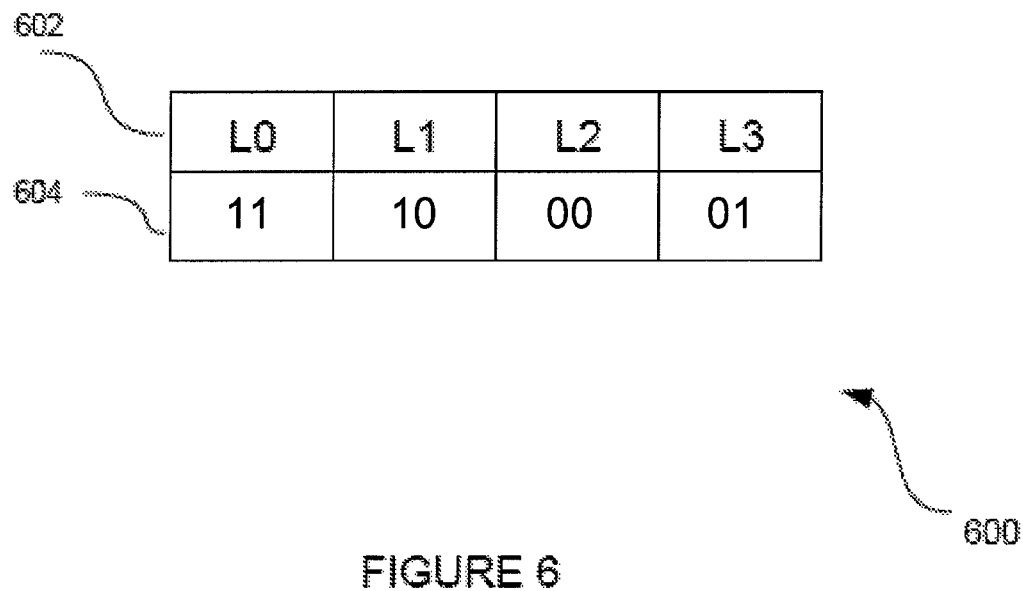
FIG. 6 shows an illustrative cell coding scheme.

FIG. 6 shows an illustrative flash storage cell coding scheme 600. As noted above, cell coding schemes map a binary number to a cell level or state. An n-level storage cell, including levels L0, L1, . . . , Ln−1, may be mapped to $n=2^x$ binary numbers, where x is an integer. The binary numbers need not be in numerical order. For example, the 4-level storage cells with cell levels 602 may be mapped to the binary sequence 604. As shown, the mapping maps L0=11, L1=10, L2=00, and L3=01. This cell coding scheme may be referred to as a Gray code. In one embodiment, a 4-level storage cell may be used to represent 2 bits of data according to the binary mapping/coding described above. For example, to represent an 8-bit data word, four storage cells each having 4 levels L0-L3 may be used, where any possible combination of two bits in the 8-bit data word may be represented by one of the L0-L3 cell levels of the corresponding storage cell. A data word, such as an 8-bit or 16-bit word, may be stored in groups of four or eight storage cells, respectively, each cell having four cell levels to represent two bits of the 8-bit or 16-bit word. Such storage cell groups are generally addressed as one collective unit from a user or computer software perspective. For example, a group of four cells holding a byte (an 8-bit word) of data may be arranged such that the data contained in the group may be read or written using a single address reference. Those skilled in the art will appreciate that other length words and/or other number of cell levels may be used to store data.

Different cell level codings may affect the way ECC detects and/or corrects bit errors. In unidirectional memories, such as NOR and NAND flash memories, writing or charging the storage cell proceeds in one direction from an initial level (for example, L0, in a 4-level cell) to a final level (for example, L3, in a 4-level cell). In such unidirectional memories, three distinct data categories may be identified: an initial category where all cells have the same value, such as binary 1, an arbitrary category where cells have arbitrary binary values (for example, representing random or arbitrary user data), and a final data category where all cells have the same value which is complementary to the value of the initial category, such as binary 0. The initial data category may correspond to a storage cell state where the accumulated charge in the cell is at a lowest point (for example, L0). The arbitrary data category may correspond to a storage cell state where the accumulated charge in the cell is at an intermediate level (for example, L1 or L2). And the final data category may correspond to a memory state where the accumulated charge in the cell is at a highest level (for example, L3).

Generally, cell levels that represent user data may transition twice: once from the initial cell state representing the initial data category (for example, all 1's) to an arbitrary, or intermediate, cell state representing the arbitrary data category, and once from the arbitrary cell state to a final cell state representing the final data category (for example, all 0's). Now, to protect user data with coherent check bits that allow detection and correction oft error bits within k user data bits, all three data categories described above may need to be covered with coherent check bits. In one embodiment, coverage of the data categories by coherent check bits may be done by adding more check bits, using additional storage cells beyond those already being used to represent the check bits, at the expense of additional storage and/or transmission bandwidth requirements. In another embodiment, the data categories may be covered by transforming a bit stream representing user data to a bit stream representing internal data, which may then be written to the cells according to the selected cell coding scheme, possibly in addition to employing a check bit inversion technique, as more fully described below with respect to FIGS. 7-9. Using the appropriate transformation and check bit inversions, the coherence of the check bits may be maintained as the storage cell transitions from the arbitrary state to the final state, during the second write, without erasing the storage cell or adding additional check bits.

In order to provide a coherent check word for a first data word, an intermediate data word, and a final data word, without using additional check bits, the internal cell coding scheme, transformation, and check bit inversions may be designed so that two conditions are satisfied. The first condition is that all of the cell states of the storage cells corresponding to the coherent check bits are at a final state when all of the cell states of the storage cells corresponding to the data bits are at the final state. The second condition is that all of the cell states of the storage cells corresponding to the coherent check bits are at the initial state when all of the cell states of the storage cells corresponding to the data bits are at the initial state.

Figures 7, 8:
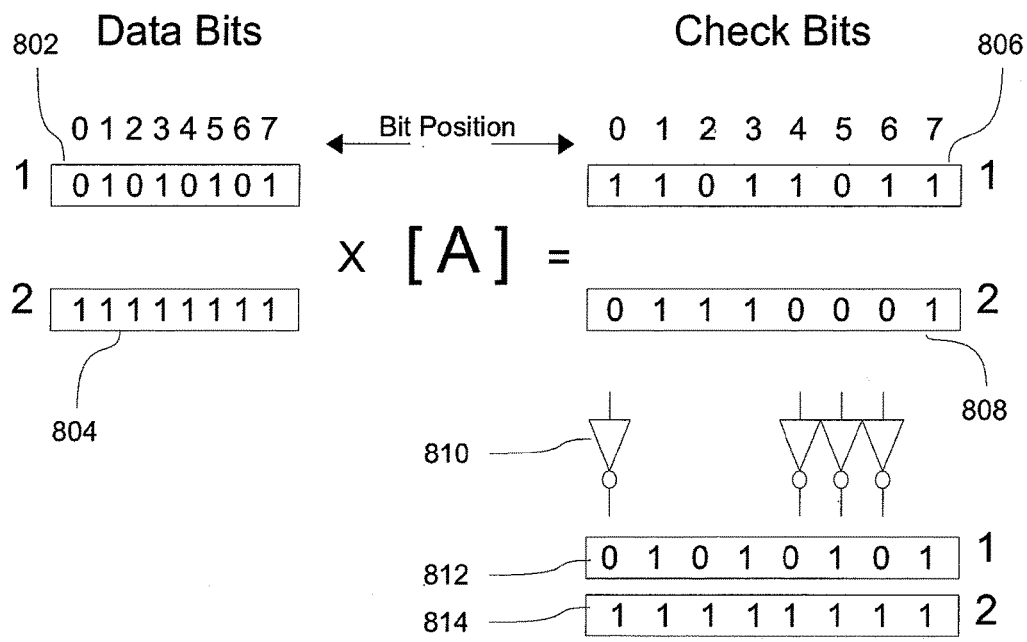
FIG. 7 shows an illustrative matrix A used in calculation of ECC.
FIG. 8 shows an illustrative application of matrix A to user data.

FIG. 7 shows an illustrative matrix A used in calculation of ECC. ECC may be applied to data by employing a generator matrix G=[I|A], where I is the k×k identity matrix (same dimension as the k data bits being protected by ECC), and A 702 is a [k×[n−k]] matrix (having columns 704 by rows 706) that defines the mathematical transformation for generating the check bits. Matrix G is a [k×n] matrix formed from the concatenation of matrices I and A. Multiplying data by G using a cross-product matrix operation generates a codeword similar in structure to codeword 500 of FIG. 5, where the k data bits are preserved in the first k bits of the n-bit codeword, followed by the [n−k] check bits.

FIG. 8 shows an illustrative application of matrix A to user data. Applying matrix A, without using matrix I, to the data generates the check bits portion of the codeword. Two sets of data 802 and 804 are shown to illustrate the operation of matrix A and check bit inversion. The changes to input data set 802 and 804 in this example may be followed independently and in parallel. Starting with data set 802, the data bits 0101 0101 in bit positions 0-7 are coded according to the Gray coding 604 of FIG. 6, which may result in the storage cells being set to the highest or final level, e.g., L3. The bit stream 0101 0101 may be internal data that results from a transformation of user data bit stream of 0000 0000 as will described with reference to FIG. 9. As the data bits of data set 802 are cross multiplied by matrix A, check word 806 with corresponding check bits in bit positions 0-7 is generated.

Check word 806, however, does not satisfy the above-identified condition that all of the parity cells are at a final state when all of the data cells are at a final state. Accordingly, selected bits, e.g., bits 0 and 4-6, of check word 806 may be inverted to generate check word 812. Inverting bits of check word 806 uses the same storage cell representing the existing check word 806, in contrast to using additional memory to represent a new check word, thus not increasing memory usage. In one embodiment, such bit inversion may be performed using inverters 810. Those skilled in the art will appreciate that bit inversion may be performed in hardware, software, or a combination of both depending on application, flexibility, and performance needs.

Similarly, data set 804, which may be represented by data cells in an initial state L0 when written according to a Gray code, may be transformed by matrix A to check bits 808 and inverted using the identified inversion bit positions (for example, 0 and 4-6) to generate check word 814. Check word 814 may satisfy the other condition identified above, e.g., that all of the parity cells are at an initial state when all of the data cells are at an initial state.

Thus, using transformation, internal coding, and bit conversion, as described, allows the generation of coherent check words for an initial, intermediate, and final data word.

Figure 9:
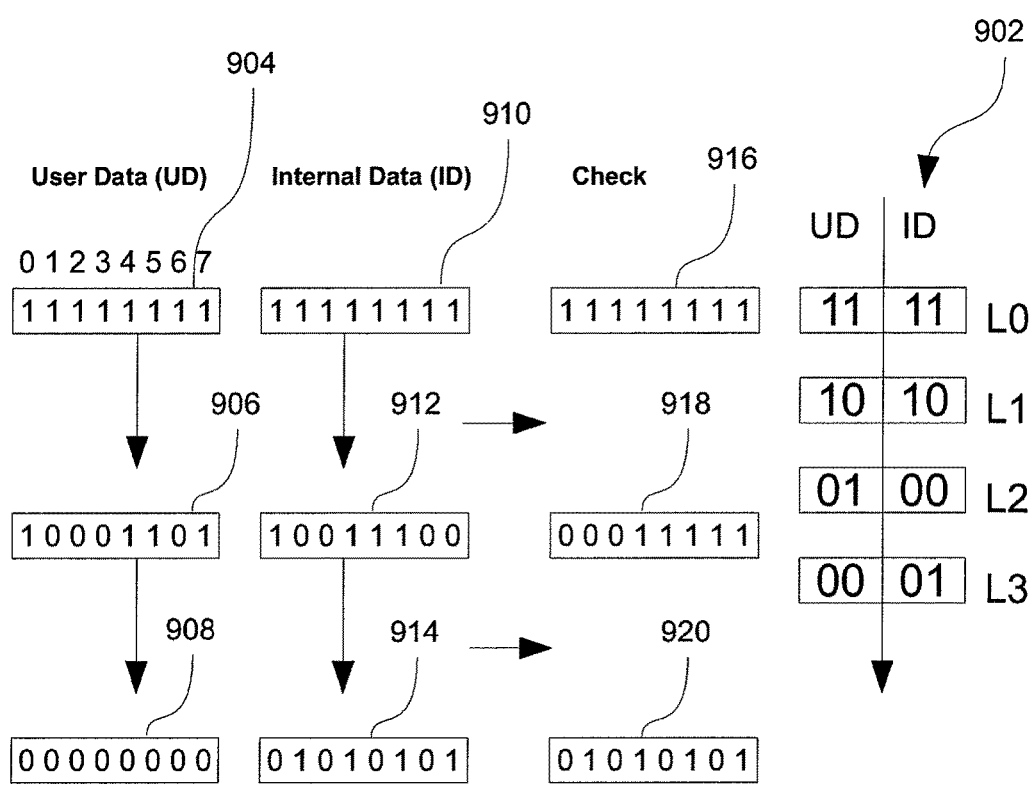
FIG. 9 shows an illustrative application of internal level coding to user data.

FIG. 9 shows an illustrative application of transformation and cell coding.

In the example shown, an initial user data word 904 includes data bits at positions 0-7=1111 1111. The user data word 904 may be transformed to internal data word 910 with data bits 1111 1111 according to the transformation function shown in the left two columns of table 902. An ECC may generate a check word 916 based on the internal data word 910 and selected bit inversion described above. The right two columns of table 902 represent the internal coding scheme that may be used for the coding of the internal data word 910 and the check word 916 into respective data cells and check cells.

The initial user data word 904 may be transitioned to an arbitrary user data word 906, e.g., 1000 1101. The user data word 906 may be internally represented by internal data word 912, e.g., 1001 1100 as transformed by the transformation function of table 902. Check word 918 may be generated based on internal data word 912 as described above.

The user data word 906 may again be transitioned to a final user data word 908, e.g., 0000 0000. The user data word 908 may be internally represented by internal data word 914, e.g., 0101 0101 as transformed by the transformation function of table 902. Check word 920 may be generated based on internal data word 914 as described above.

The check words, e.g., check words 916, 918, and 920 may be coherent with the check cells satisfying the above-identified conditions.

The initial user data words 904, 906, 908, may be consecutively received so that the generating and writing of the internal data words 910, 910, and 914 and check words 916, 918, and 920 may also be consecutively generated and written. Thus, there will be no intervening erase operations between these consecutive operations.

Figure 10:
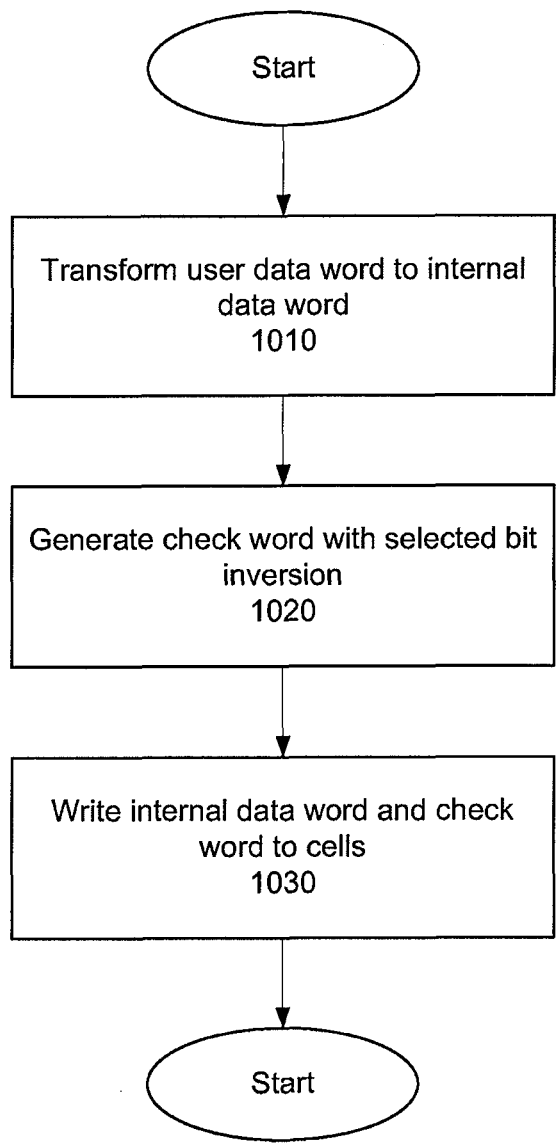
FIG. 10 shows an illustrative process of protecting user data with ECC check bits according to aspects of present disclosure.

FIG. 10 shows an illustrative process of protecting user data with ECC check bits according to aspects of present disclosure. At block 1010, the process may transform a bit stream of user data, e.g., a user data word, to a bit stream of internal data, e.g., an internal data word, according to a selected transformation function. The user data word may be the same size as the internal data word. The transformation function used may be similar to the transformation function described in table 902.

At block 1020, the process may generate one or more parity bits, e.g., a check word, with selected bits inverted, according to an ECC. The generation of the check word may be based at least in part on a function of the internal data word and a matrix of the ECC. Selection of the bits for inversion may be based at least in part on satisfying the two conditions identified above, e.g., that the check cell states equal to the data cell states when the data cell states are either in an initial state or a final state.

At block 1030, the process may write the internal data word and the check word to corresponding storage cells. This may be done, e.g., according to an internal cell coding scheme such as the one identified above in FIG. 6.

The process described in FIG. 10 may be reversed to recover the internal data word, the check word, and, ultimately, the user data.

It will be understood that each block of the flowchart illustration, and combinations of blocks in the flowchart illustration, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operations to be performed by the processor to produce a computer implemented process such that the instructions, which execute on the processor to provide operations for implementing the actions specified in the flowchart block or blocks. The computer program instructions may also cause at least some of the operations shown in the blocks of the flowchart to be performed in parallel. Moreover, some of the operations may also be performed across more than one processor, such as might arise in a multi-processor computer system. In addition, one or more blocks or combinations of blocks in the flowchart illustration may also be performed concurrently with other blocks or combinations of blocks, or even in a different sequence than illustrated without departing from the scope or spirit of the invention.

Accordingly, blocks of the flowchart illustration support combinations of means for performing the specified actions, combinations of operations for performing the specified actions and program instruction means for performing the specified actions. It will also be understood that each block of the flowchart illustration, and combinations of blocks in the flowchart illustration, can be implemented by special purpose hardware-based systems which perform the specified actions or operations, or combinations of special purpose hardware and computer instructions.

Changes can be made to the claimed invention in light of the above Detailed Description. While the above description details certain embodiments of the invention and describes the best mode contemplated, no matter how detailed the above appears in text, the claimed invention can be practiced in many ways. Details of the system may vary considerably in its implementation details, while still being encompassed by the claimed invention disclosed herein.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the claimed invention to the specific embodiments disclosed in the specification, unless the above Detailed Description section explicitly defines such terms. Accordingly, the actual scope of the claimed invention encompasses not only the disclosed embodiments, but also all equivalent ways of practicing or implementing the claimed invention.

The above specification, examples, and data provide a complete description of the manufacture and use of the composition of the invention. Since many embodiments of the invention can be made without departing from the spirit and scope of the invention, the invention resides in the claims hereinafter appended.

What is claimed is:

1. A method of generating coherent check words for programming memory cells to an intermediate state and to a final state without an intervening erase operation, the method comprising:
   receiving a first data;
   computing a first check code for the first data;
   programming the first data and the first check code to a plurality of memory cells to change contents of the plurality of memory cells from an initial state to the intermediate state;
   receiving a second data;
   computing a second check code for the second data; and
   programming the second data and the second check code to the plurality of memory cells without erasing the plurality of memory cells provided that contents of the second data and the second check code would be at the final state after programming.

2. The method of claim 1, further comprising:
receiving user data; and
transforming the user data to the first data according to a transformation function, the first data being a same size as the user data.

3. The method of claim 2, wherein transforming further comprises transforming according to a Gray code.

4. The method of claim 1, wherein the plurality of memory cells comprise unidirectional non-volatile data storage cells.

5. The method of claim 1, wherein the plurality of memory cells comprise flash memory cells.

6. The method of claim 1, further comprising:
computing a first matrix multiplication of the first data and a matrix to generate a third check code;
computing a first matrix multiplication of the second data and the matrix to generate a fourth check code;
generating an inversion pattern based on a second matrix multiplication of an initial data comprising erased states and the matrix;
selectively inverting bits of the third check code based on the inversion pattern to generate the first check code, wherein the inversion pattern comprises a plurality of bits having a first state or a second state, wherein selectively inverting comprises inverting bits of the first check code corresponding to bit positions of the inversion pattern having the first state and not inverting bit positions corresponding to the second state; and
selectively inverting bits of the fourth check code based on the inversion pattern to generate the second check code.

7. The method of claim 6, wherein the matrix comprises:

$$\begin{bmatrix} 0010 & 1011 \\ 1111 & 1110 \\ 1011 & 0010 \\ 0001 & 1101 \\ 1110 & 1000 \\ 0100 & 1111 \\ 1101 & 1011 \\ 0111 & 0111 \end{bmatrix}.$$

8. An apparatus comprising:
a controller configured to:
receive a first data;
compute a first check code for the first data;
program the first data and the first check code to a plurality of memory cells to change contents of the plurality of memory cells from an initial state to an intermediate state;
receive a second data;
compute a second check code for the second data; and
program the second data and the second check code to the plurality of memory cells without erasing the plurality of memory cells provided that contents of the second data and the second check code would be at a final state after programming.

9. The apparatus of claim 8, wherein the controller is further configured to:
receive user data; and
transform the user data to the first data according to a transformation function, the first data being a same size as the user data.

10. The apparatus of claim 9, wherein the controller is further configured to transform the user data according to a Gray code.

11. The apparatus of claim 8, wherein the plurality of memory cells comprise unidirectional non-volatile data storage cells.

12. The apparatus of claim 8, wherein the plurality of memory cells comprise flash memory cells.

13. The apparatus of claim 8, wherein the controller is further configured to:
compute a first matrix multiplication of the first data and a matrix to generate a third check code;
compute a first matrix multiplication of the second data and the matrix to generate a fourth check code;
generate an inversion pattern based on a second matrix multiplication of an initial data comprising erased states and the matrix;
selectively invert bits of the third check code based on the inversion pattern to generate the first check code, wherein the inversion pattern comprises a plurality of bits having a first state or a second state, wherein selectively inverting comprises inverting bits of the first check code corresponding to bit positions of the inversion pattern having the first state and not inverting bit positions corresponding to the second state; and
selectively invert bits of the fourth check code based on the inversion pattern to generate the second check code.

14. The apparatus of claim 13, wherein the matrix comprises:

$$\begin{bmatrix} 0010 & 1011 \\ 1111 & 1110 \\ 1011 & 0010 \\ 0001 & 1101 \\ 1110 & 1000 \\ 0100 & 1111 \\ 1101 & 1011 \\ 0111 & 0111 \end{bmatrix}.$$

15. A memory system comprising:
a plurality of memory cells; and
a controller configured to:
receive a first data;
compute a first check code for the first data;
program the first data and the first check code to the plurality of memory cells to change contents of the plurality of memory cells from an initial state to an intermediate state;
receive a second data;
compute a second check code for the second data; and
program the second data and the second check code to the plurality of memory cells without erasing the plurality of memory cells provided that contents of the second data and the second check code would be at a final state after programming.

16. The memory system of claim 15, wherein the controller is further configured to:
receive user data; and
transform the user data to the first data according to a transformation function, the first data being a same size as the user data.

17. The memory system of claim 16, wherein the controller is further configured to transform the user data according to a Gray code.

18. The memory system of claim 15, wherein the plurality of memory cells comprise flash memory cells.

19. The memory system of claim 15, wherein the controller is further configured to:
  compute a first matrix multiplication of the first data and a matrix to generate a third check code;
  compute a first matrix multiplication of the second data and the matrix to generate a fourth check code;
  generate an inversion pattern based on a second matrix multiplication of an initial data comprising erased states and the matrix;
  selectively invert bits of the third check code based on the inversion pattern to generate the first check code, wherein the inversion pattern comprises a plurality of bits having a first state or a second state, wherein selectively inverting comprises inverting bits of the first check code corresponding to bit positions of the inversion pattern having the first state and not inverting bit positions corresponding to the second state; and
  selectively invert bits of the fourth check code based on the inversion pattern to generate the second check code.

20. The memory system of claim 19, wherein the matrix comprises:

$$\begin{bmatrix} 0010 & 1011 \\ 1111 & 1110 \\ 1011 & 0010 \\ 0001 & 1101 \\ 1110 & 1000 \\ 0100 & 1111 \\ 1101 & 1011 \\ 0111 & 0111 \end{bmatrix}.$$

* * * * *